(12) United States Patent
Jensen et al.

(10) Patent No.: US 8,119,905 B2
(45) Date of Patent: Feb. 21, 2012

(54) COMBINATION NON-IMAGING CONCENTRATOR

(75) Inventors: John Steffen Jensen, Santa Cruz, CA (US); Mark McDonald, Milpitas, CA (US)

(73) Assignee: SolFocus, Inc., San Jose, CA (US)

( * ) Notice: Subject to any disclaimer, the term of this patent is extended or adjusted under 35 U.S.C. 154(b) by 576 days.

(21) Appl. No.: 11/960,896

(22) Filed: Dec. 20, 2007

(65) Prior Publication Data

US 2009/0114280 A1 May 7, 2009

Related U.S. Application Data

(60) Provisional application No. 60/985,199, filed on Nov. 3, 2007.

(51) Int. Cl.
*H01L 31/00* (2006.01)
*G02B 17/00* (2006.01)

(52) U.S. Cl. ........................... 136/259; 359/731

(58) Field of Classification Search .................. 136/259; 359/726–736, 851, 853
See application file for complete search history.

(56) References Cited

U.S. PATENT DOCUMENTS

| | | | |
|---|---|---|---|
| 4,114,592 A | 9/1978 | Winston | |
| 4,275,950 A | 6/1981 | Meyer | |
| 4,286,581 A * | 9/1981 | Atkinson, Jr. | 126/585 |
| 4,335,707 A * | 6/1982 | Lindenbauer | 126/576 |
| 4,411,490 A * | 10/1983 | Daniel | 126/648 |
| 4,755,921 A * | 7/1988 | Nelson | 362/307 |
| 4,830,678 A * | 5/1989 | Todorof et al. | 136/259 |
| 4,848,319 A * | 7/1989 | Appeldorn | 126/700 |
| 5,062,899 A * | 11/1991 | Kruer | 136/259 |
| 5,220,462 A | 6/1993 | Feldman, Jr. | |
| 5,243,459 A | 9/1993 | Winston et al. | |
| 5,409,550 A * | 4/1995 | Safir | 136/246 |
| 5,971,551 A | 10/1999 | Winston et al. | |
| 6,020,553 A * | 2/2000 | Yogev | 136/246 |
| 6,057,505 A * | 5/2000 | Ortabasi | 136/246 |
| 6,299,317 B1 | 10/2001 | Gorthala | |
| 6,512,600 B1 * | 1/2003 | Kawai et al. | 358/475 |
| 6,700,054 B2 | 3/2004 | Cherney | |

(Continued)

FOREIGN PATENT DOCUMENTS

KR   20070102326 A   10/2007

OTHER PUBLICATIONS

Lifante, G. et al., Solar Concentrators Using Total Internal Reflection, Dec. 15, 1983, Applied Optics, vol. 22, No. 24, pp. 3966-3970.*
Zhang, Y.W. et al., "Photovoltaic concentrator using a holographic optical element", Aug. 1988, Applied Optics, vol. 27, No. 16, pp. 3556-3560.*

(Continued)

*Primary Examiner* — Basia Ridley
*Assistant Examiner* — Tamir Ayad
(74) *Attorney, Agent, or Firm* — The Mueller Law Office, P.C.

(57) ABSTRACT

The present invention is a combination non-imaging concentrator in which at least one surface or volume is incorporated as an optical element to increase obliquity of reflection at walls of a light guide. The combination non-imaging concentrator may be used in a solar energy system to receive solar radiation from optical components and then output the solar radiation to a photovoltaic cell for conversion to electricity. One or more lenses may be formed integrally with the light guide, or may be used in conjunction with the light guide as separate components.

18 Claims, 3 Drawing Sheets

U.S. PATENT DOCUMENTS

| | | |
|---|---|---|
| 6,986,591 B2 | 1/2006 | Pate |
| 7,081,584 B2 | 7/2006 | Mook |
| 2006/0207650 A1 | 9/2006 | Winston |
| 2006/0266408 A1 | 11/2006 | Horne |
| 2008/0223443 A1* | 9/2008 | Benitez et al. ............... 136/259 |

OTHER PUBLICATIONS

Jenkins, D. et al., "Integral design method for nonimaging concentrators", Oct. 1996, Journal Optical Society of America, vol. 13, No. 10, pp. 2106-2116.*

* cited by examiner

COMBINATION NON-IMAGING CONCENTRATOR

RELATED APPLICATIONS

This application claims priority to U.S. Provisional Patent Application Ser. No. 60/985,199 filed on Nov. 3, 2007, entitled "Combination Non-Imaging Concentrator," which is hereby incorporated by reference as if set forth in full in this application for all purposes.

BACKGROUND OF THE INVENTION

Solar power generation involves harvesting solar radiation and converting it to usable energy, such as direct current (DC) electricity. Solar energy may be collected directly onto photovoltaic cells, such as in flat panel technology, or may undergo various stages of refraction and reflection, such as in solar concentrators, before impacting a photovoltaic solar cell. Solar concentrators use vastly decreased amounts of costly photovoltaic material by concentrating incoming solar radiation onto a surface area which is much smaller than that of the entry window area of the overall concentrator unit. Thus, the efficiency of a solar concentrator unit is affected not only by the amount of solar energy captured by the unit, but also by the ability of the unit to accurately deliver the concentrated light to the relatively small photovoltaic cell. Efforts to increase the efficiency of solar concentrators include using solar tracking systems to maximize the intensity of incoming radiation, and modifying the materials used to fabricate components in order to enhance reflective and refractive properties. In addition, solar concentrator efficiency has been addressed by changing the design of individual components to increase acceptance angles. For instance, the shapes of entry window lenses and the wall profiles of mirrors used for collecting solar radiation have been varied widely in efforts to optimize solar concentration.

One type of solar concentrator, disclosed in U.S. Patent Publication No. 2006/0266408, entitled "Concentrator Solar Photovoltaic Array with Compact Tailored Imaging Power Units" utilizes a primary mirror and a secondary mirror to reflect and focus solar energy onto a non-imaging concentrator which delivers the energy to a solar cell. A similar type of solar concentrator, disclosed in U.S. Patent Publication No. 2006/0207650 and entitled "Multi-Junction Solar Cells with an Aplanatic Imaging System and Coupled Non-Imaging Light Concentrator," uses a solid optic, out of which a primary mirror is formed oil its bottom surface and a secondary mirror is formed in its upper surface. Solar radiation enters the upper surface of the solid optic, reflects from the primary mirror surface to the secondary mirror surface, and then enters a non-imaging concentrator which outputs the light onto a photovoltaic solar cell. For both of these solar concentrators, variances in incoming radiation angle are greatly multiplied by having light reflect off of primary and secondary mirrors. For instance, a 1° change in incoming radiation angle may result in a 25° change in angle at the non-imaging concentrator.

Thus, the ability of the non-imaging concentrator to accept a wide range of incoming light angles can increase the efficiency of a solar concentrator system. It is desirable to design a non-imaging concentrator having an improved acceptance angle while maintaining its performance.

SUMMARY OF THE INVENTION

The present invention is a combination non-imaging concentrator in which a lens is combined with a light guide. At least one surface or volume is incorporated as an optical element to increase obliquity of reflection at walls of the light guide, thereby increasing the acceptance angle of the combination non-imaging concentrator. The combination non-imaging concentrator may be used in a solar energy system to receive solar radiation from optical components and then output the solar radiation to a photovoltaic cell for conversion to electricity. One or more lenses may be formed integrally with the light guide, or the lenses may be separate components used in conjunction with the light guide. Anti-reflection coatings may be optionally applied at the entrance and exit surfaces of the lens and light guide.

DETAILED DESCRIPTION OF THE EMBODIMENTS

Reference now will be made in detail to embodiments of the disclosed invention, one or more examples of which are illustrated in the accompanying drawings.

Figure 1:
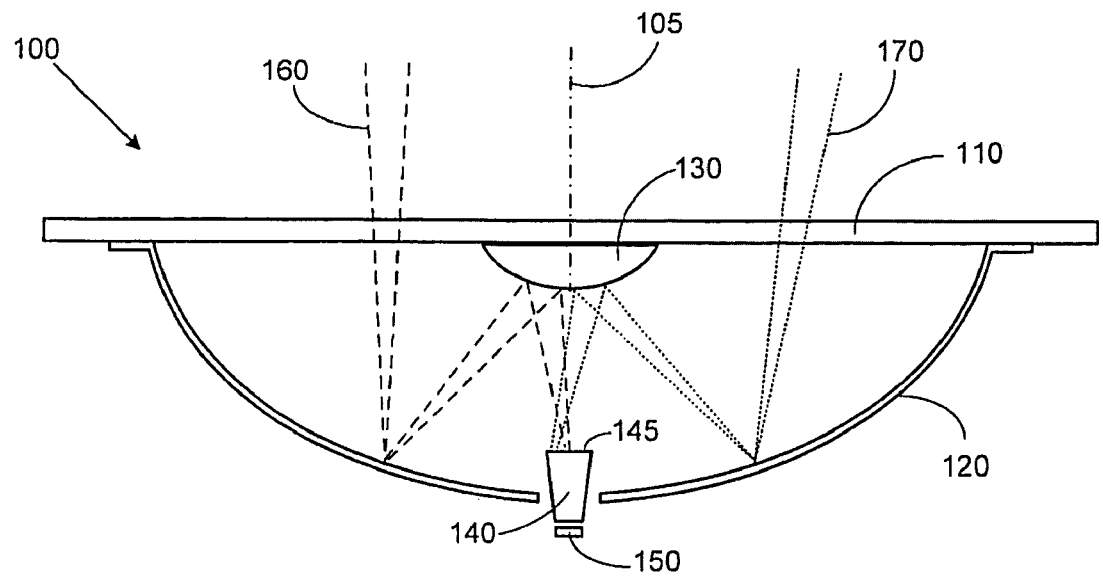
FIG. 1 is a cross-sectional view of an exemplary solar concentrator unit.

FIG. 1 depicts a solar concentrator 100 of the type disclosed in U.S. Patent Publication No. 2006/0266408, entitled "Concentrator Solar Photovoltaic Array with Compact Tailored Imaging Power Units." Solar concentrator 100 includes a front panel 110, a primary mirror 120, a secondary mirror 130, a non-imaging concentrator 140, and a solar cell 150. The presence of non-imaging concentrator 140 allows solar cell 150 to be positioned externally to primary mirror 120, where heat sinking measures may be applied. When the sun is aligned with the central axis 105 of solar concentrator 100, solar radiation enters solar concentrator 100 as exemplified by "on-axis" rays 160, illustrated by dashed lines. On-axis rays 160 enter solar concentrator 100 through front panel 110, reflect off of primary mirror 120 and secondary mirror 130, and then enter non-imaging concentrator 140 substantially focused at the center of the entrance aperture 145 of non-imaging concentrator 140. While a tracking system may be used to maintain alignment of solar concentrator 100 with the sun's movements, exact alignment is not always possible. Tracking errors of even a fraction of a degree can affect energy transmission. For example, when the sun is not aligned with solar concentrator 100 due to tracking error or other circumstances, exemplary off-axis rays 170, illustrated by dotted lines, reach non-imaging concentrator 140 with a more angled approach and are focused off-center.

Figure 2A:
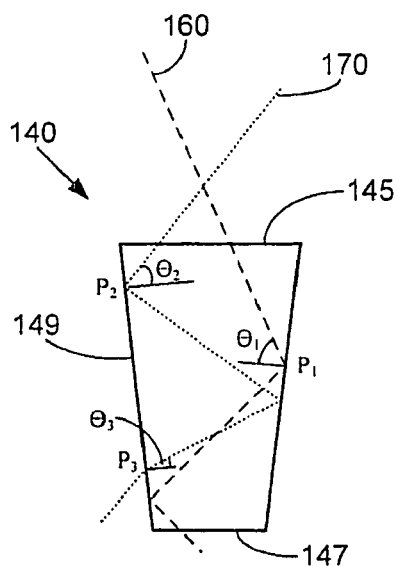
FIGS. 2A and 2B provide close-up, cross-sectional views of the non-imaging concentrator from FIG. 1.

The effect of tracking error on energy transmission is shown in more detail in the close-up view of non-imaging concentrator 140 in FIG. 2A. Non-imaging concentrator 140 has an entrance aperture 145, an exit aperture 147, and side walls 149, and may take the form of, for example, a truncated pyramidal prism or a truncated cone. Similar to FIG. 1, FIG.

2A shows an on-axis ray 160 contrasted to an off-axis ray 170. On-axis ray 160 enters entrance aperture 145 such that on-axis ray 160 impacts side wall 149 at a point $P_1$ with a relatively high angle $\theta_1$. The angle $\theta_1$ exceeds the critical angle required for total internal reflection (TIR), such as approximately 41.8° for a glass-air interface. Consequently, in this exemplary depiction of FIG. 2A, on-axis ray 160 undergoes two total internal reflections before it reaches exit aperture 147 where it will impact a photovoltaic cell. In contrast, off-axis ray 170 enters non-imaging concentrator 140 at an angle $\theta_2$ which is smaller than $\theta_1$, and impacts side wall 149 at a point $P_2$ which is higher on side wall 149 than $P_1$. Because of the higher initial intersection point and the smaller angle of incidence with respect to the side wall 149, off-axis ray 170 undergoes three reflections in this exemplary illustration. At the third reflection point $P_3$, the angle of incidence $\theta_3$ of off-axis ray 170 drops below the critical angle required for TIR, and consequently at least a portion of off-axis ray 170 refracts through side wall 149 rather than being internally reflected. Leakage of off-axis ray 170, also known as TIR escape, out of non-imaging concentrator 140 translates into energy transmission losses as well as potential heat damage to surrounding wires or other components within the solar concentrator unit.

Figure 2B:
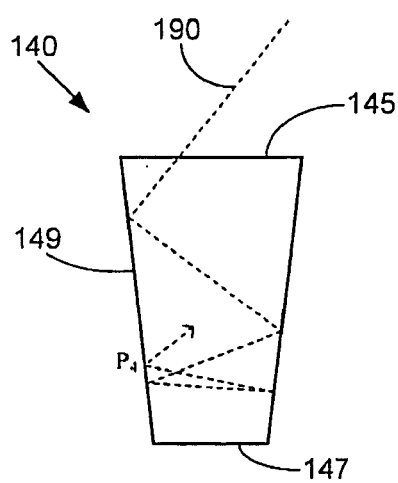

In FIG. 2B, another potential form of energy loss is shown. Standard optical conduits, often referred to as light pipes or optical rods, maintain a uniform diameter along their length. In the non-imaging concentrator 140 shown here, however, side walls 149 are angled outward to create a larger entrance aperture 145 so that a wider range of angles may enter non-imaging concentrator 140. Because of the convergent shape of non-imaging concentrator 140, light rays 190, whether on-axis or off-axis, after multiple reflections may reach such an angle that they reflect back toward entrance aperture 145. Point $P_4$ in FIG. 2B exemplifies the point at which light rays 190 reverse in direction. Light rays 190 which reflect back toward entrance aperture 145 rather than reaching exit aperture 147 result in further energy losses in addition to those caused by TIR escape.

Figures 3A, 3B:
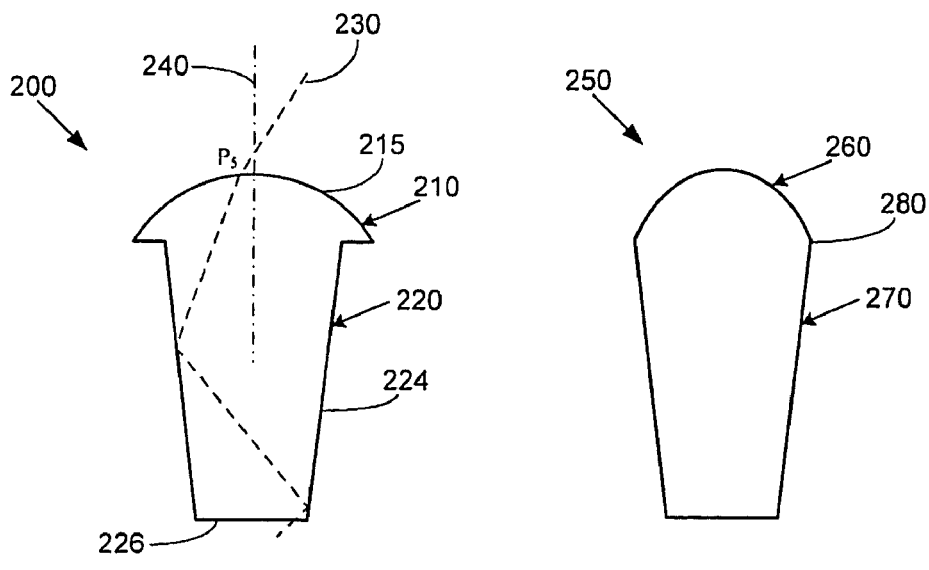
FIGS. 3A and 3B are cross-sectional views of embodiments of combination non-imaging concentrators of the present invention.

Now turning to FIG. 3A, a combination non-imaging concentrator 200 according to the present invention includes a lens 210 incorporated onto a light guide 220. Lens 210 may be, for example, a field lens. Lens 210 has an input surface 215, while light guide 220 has side walls 224 and an exit aperture 226. Central axis 240 of combination non-imaging concentrator 200 is represented by a vertical line in FIG. 3A. In the embodiment of FIG. 3A, the input surface 215 of lens 210 is convex, and lens 210 is monolithically integrated with light guide 220. Lens 210 has a cross-sectional shape, not shown, to accommodate the shape of light guide 220. For example, for a light guide 220 having a form of a truncated cone, lens 210 has circular cross-section. For a light guide 220 taking the form of a square truncated pyramid, lens 210 has a substantially square cross-section. Note that the perimeter of lens 210 need not extend the edges of light guide 220. As shown in FIG. 3B, a combination non-imaging concentrator 250 has a lens 260 and a light guide 270 whose perimeters are substantially flush at interface 280.

To illustrate the effect of lens 210 on energy transmission, an off-axis ray 230 in FIG. 3A enters combination non-imaging concentrator 200 at entrance aperture 215 and is refracted toward central axis 240 by lens 210 at point $P_5$. Lens 210 causes a more oblique incidence to the side walls 224 of light guide 220, typically enabling more potential reflections from the side walls 224 before violating TIR limits. This in turn increases the realized acceptance angle, for example by approximately 0.5 degrees, for a given required minimum system transmission. That is, the lens 210 enables solar rays to enter non-imaging concentrator 200 at a wider range of angles without resulting in TIR escape, thus maintaining a desired threshold of energy transmission. The effect of the lens 210 is to increase the solar concentration ratio and enable the solar concentrator unit to maintain a minimum acceptance angle. Correspondingly, an increase in solar concentration due to the use of a combination non-imaging concentrator advantageously allows for a decrease in the use of expensive triple junction photovoltaic material.

In the combination non-imaging concentrator 200 of FIG. 3A, an anti-reflection coating may be applied to the input surface 215 of lens 210. This anti-reflection coating may be, for example, a quarter wave layer with an index of refraction equal to the square root of the index for lens 210. To have the desired refractive effect in this optical system, the curved input surface 215 of lens 210 in FIG. 3 is shaped in such a way as to increase the angle of incidence progressively with tracking error. As angle of incidence increases, reflections at input surface 215, which may be for example an air-glass interface, also increases and consequently the acceptance angle is reduced. Thus, although reflection losses may occur without a lens, the effect is more pronounced with a lens. An anti-reflection coating at input surface 215 reduces potential reflection losses, losses which can counteract the benefits of lens 210 on acceptance angle.

Figure 4:
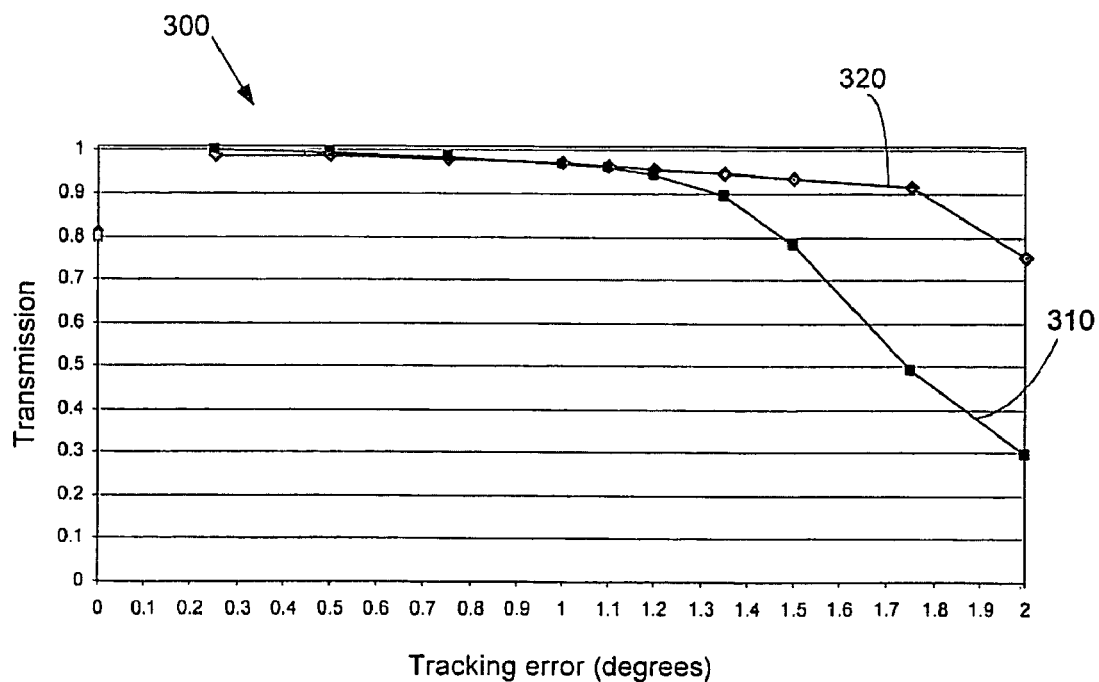
FIG. 4 is a graph illustrating energy transmission of a light guide with a lens and without a lens.

The graph 300 of FIG. 4 further illustrates the beneficial effect of a lens on energy transmission. Line 310, shown with square plotting points, represents an example transmission from a truncated pyramid light guide without a lens. Transmission is seen to decrease as tracking error increases. Line 320, shown with diamond plotting points, represents an example transmission from a combination non-imaging concentrator formed by the addition of a quadratic convex surface monolithically attached field lens to a truncated pyramid light guide. It can be seen from graph 300 that transmission is less affected by tracking error with the combination non-imaging concentrator of line 320 compared to the light guide without a lens as represented by line 310. Note that while graph 300 exemplifies the benefit of a quadratic field lens, alternatives to quadratic field lenses may be utilized, including aspheric lenses, diffractive lenses, Fresnel type lenses, bulk refractors using a gradient index, and volume diffractive elements.

Figure 5:
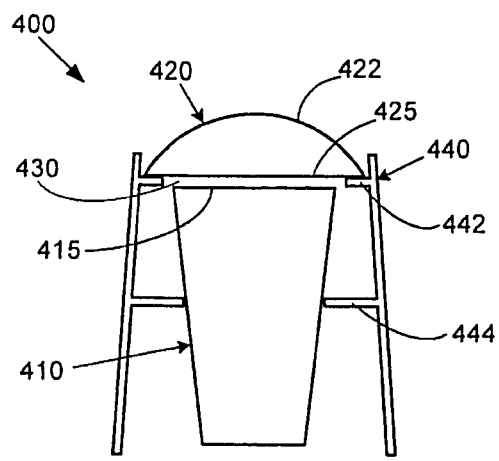
FIG. 5 illustrates an embodiment of the present invention in which a combination non-imaging concentrator incorporates a support structure.

An alternative embodiment of the present invention is shown in FIG. 5. In this embodiment, a combination non-imaging concentrator 400 includes a light guide 410 and a lens 420 which is separated from light guide 410 by an air gap 430. A support structure 440, which may be, for example, a sheet metal enclosure or wire frame structure around combination non-imaging concentrator 400, holds lens 420 above entrance aperture 415 of light guide 410 with flanges 442 to create the air gap 430. Secondary flanges 444 within support structure 440 may be incorporated to provide stability to light guide 410. The embodiment of FIG. 5 allows light guide 410 and lens 420 to be fabricated from two separate components, which may provide a lower cost alternative to the monolithically integrated combination non-imaging concentrators 200 and 250 of FIGS. 3A and 3B, respectively. To minimize interface reflection losses in the combination non-imaging concentrator 400, anti-reflection coatings may be applied to input surface 422 of lens 420, to bottom surface 425 of lens 420, and to entrance aperture 415 of light guide 410. Note that instead of utilizing a support structure 440, the lens 420 may be coupled to light guide 410 by filling air gap 430 with an adhesive. However, because the interface between lens 420 and light guide 410 lies at the focal plane of the solar concentrator unit, an adhesive used to couple the lens 420 and light guide 410 must be able to withstand substantially high temperatures.

Figures 6A, 6B, 6C:
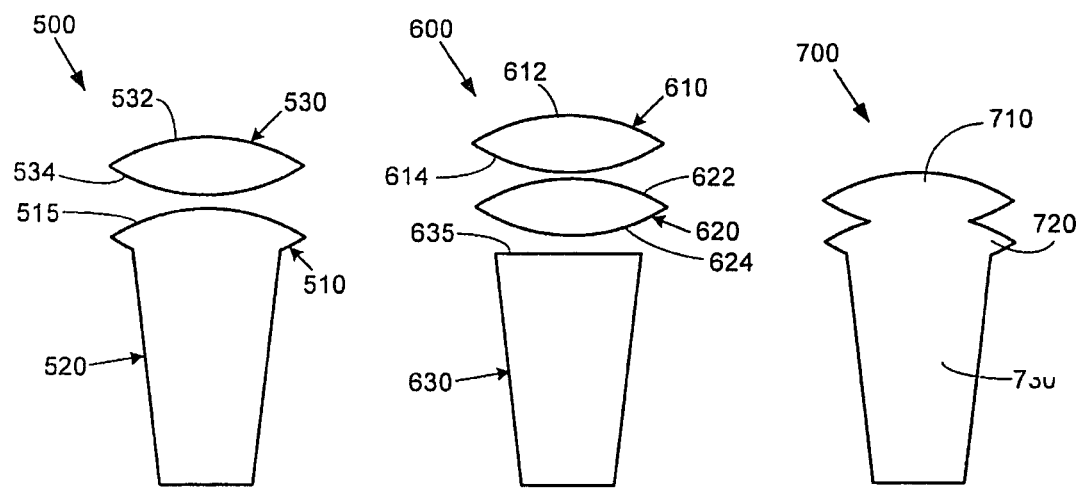
FIGS. 6A, 6B, and 6C show cross-sectional views of yet further embodiments of the present invention.

Yet further embodiments of the present invention are shown in FIGS. 6A, 6B, and 6C, in which separate or semi-separate refractive surfaces are added to further enhance acceptance angle and light gathering. In FIG. 6A, a combination non-imaging concentrator 500 utilizes a double-sided convex lens 510 monolithically integrated onto a light guide 520. A secondary lens 530 is positioned above lens 510, such as by using the support structure of FIG. 5, to provide further refraction of incoming solar radiation. Adhesives may alternatively be used between lenses 510 and 530. Anti-reflection coatings may be applied to input surface 515 of lens 510, as well as to surfaces 532 and 534 of secondary lens 530 to reduce reflection losses.

In FIG. 6B, a combination non-imaging concentrator 600 incorporates two lenses 610 and 620, both lenses 610 and 620 being separate components from a light guide 630. Again, a support structure or adhesives may be used to facilitate the combination of lenses 610 and 620. Anti-reflection coatings may be applied to any or all of the surfaces 612, 614, 622, 624, and 635 to reduce interface reflection losses. Yet another embodiment of the present invention is shown in FIG. 6C, in which a combination non-imaging concentrator 700 has two lenses 710 and 720, both integrated with a light guide 730 to form a single component. Other configurations of lenses and light guides may also be utilized.

Although the addition of a lens increases the complexity of a non-imaging concentrator compared to using a light guide alone, the cost effect is relatively small compared to that of the overall solar concentrator system. Moreover, the effect of the increased complexity of a combination non-imaging concentrator may be offset or overcome by resulting improvements in tracker accuracy and manufacturing control.

Although embodiments of the invention have been discussed primarily with respect to specific embodiments thereof, other variations are possible. For instance, although the light guides in this disclosure have been depicted with linear side walls, the side walls may instead be curved as desired to optimize optical properties of the light guide. While up to two substantially identical lenses have been depicted in the various embodiments of this disclosure, more than two lenses may be used, and each lens may have a different shape or size as required to achieve the necessary refractive properties. In addition to being used in solar energy systems, the combination non-imaging concentrator of the present invention may be applicable to other systems in which non-collimated light is injected into a converging light guide.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention. Thus, it is intended that the present subject matter covers such modifications and variations as come within the scope of the appended claims and their equivalents.

What is claimed is:

1. A solar concentrator unit, comprising:
a primary mirror for reflecting solar radiation;
a combination non-imaging concentrator comprising:
  a) a light guide having an entrance aperture and an exit aperture, wherein said entrance aperture is larger than said exit aperture; and
  b) a field lens positioned to receive said radiation reflected from said primary mirror, said lens having an input surface and an output surface, and said lens refracting said radiation toward said entrance aperture of said light guide;
an energy conversion device positioned near said exit aperture of said light guide of said combination non-imaging concentrator; and
a secondary mirror having a focal point, wherein said secondary mirror reflects said solar radiation from said primary mirror to said combination non-imaging concentrator;
wherein said light guide has an acceptance angle, and wherein said refracting by said field lens increases said acceptance angle; and
wherein said light guide has a height from said entrance aperture to said exit aperture, wherein i) said entrance aperture is positioned at said focal point of said secondary mirror, and ii) said exit aperture and said energy conversion device are positioned externally to said primary mirror.

2. The solar concentrator unit of claim 1, wherein said combination non-imaging concentrator further comprises an air gap between said output surface of said lens and said entrance aperture of said light guide.

3. The solar concentrator unit of claim 1, wherein said combination non-imaging concentrator further comprises an anti-reflection coating on said input surface of said lens.

4. The solar concentrator unit of claim 1, wherein said input surface of said lens is convex.

5. The solar concentrator unit of claim 4, wherein said output surface of said lens is convex.

6. The solar concentrator unit of claim 1, further comprising a second lens near said input surface of said lens.

7. The solar concentrator unit of claim 1, wherein said light guide is substantially a truncated square pyramid.

8. The solar concentrator unit of claim 1, further comprising a support structure for said combination non-imaging concentrator, wherein said support structure is configured to hold said lens within said solar concentrator unit.

9. The solar concentrator unit of claim 1, wherein said lens is monolithically integrated with said light guide.

10. The solar concentrator unit of claim 1, wherein said light guide further comprises a central axis and side walls; and
wherein said refracting causes said radiation to refract toward said central axis, to cause a more oblique incidence to said side walls and more total internal reflections in said light guide compared to without said field lens.

11. A combination non-imaging concentrator, comprising:
a light guide having a central axis and an entrance aperture and an exit aperture, wherein said entrance aperture is larger than said exit aperture; and
a field lens positioned to receive solar radiation and to refract said solar radiation toward said central axis of said light guide, said lens having an input surface and an output surface, said output surface facing said entrance aperture of said light guide, and wherein said solar radiation is reflected from a primary mirror to a secondary mirror and then to said combination non-imaging concentrator;

wherein said refracted solar radiation engages in more than one total internal reflections within said light guide;

wherein said non-imaging concentrator is shaped substantially like a truncated square pyramid;

wherein said light guide has an acceptance angle, and wherein said refraction by said field lens increases said acceptance angle; and wherein said light guide has a height from said entrance aperture to said exit aperture, wherein 1) said entrance aperture is positioned at a focal point of said secondary mirror, and 2) said exit aperture is positioned externally to said primary mirror.

12. The combination non-imaging concentrator of claim 11, further comprising an air gap between said output surface of said lens and said entrance aperture of said light guide.

13. The combination non-imaging concentrator of claim 11, further comprising an anti-reflection coating on said input surface of said lens.

14. The combination non-imaging concentrator of claim 11, wherein said lens is monolithically integrated with said light guide.

15. The combination non-imaging concentrator of claim 11, wherein said light guide further comprises side walls; and wherein said refracting causes said radiation to refract toward said central axis, to cause a more oblique incidence to said side walls and more total internal reflections in said light guide compared to without said field lens.

16. A method of delivering light through a combination non-imaging concentrator, said combination non-imaging concentrator comprising a light guide and a field lens, said light guide having an entrance aperture and an exit aperture and a central axis, said entrance aperture being wider than said exit aperture, and wherein said lens has an input surface and an output surface, said lens being positioned near said entrance aperture, said method comprising:

receiving light at said input surface of said lens, wherein said light is reflected from a primary mirror to a secondary mirror to said lens, wherein said entrance aperture is positioned at a focal point of the secondary mirror, and wherein said exit aperture is positioned externally to said primary mirror;

refracting said light through said lens, said refracting causing said light to bend toward said central axis of said light guide;

passing said light through said entrance aperture of said light guide;

wherein said non-imaging concentrator is shaped substantially like a truncated square pyramid;

engaging said light in more than one total internal reflections within said light guide prior to said light exiting said light guide; and wherein said light guide has an acceptance angle, and wherein said refracting increases said acceptance angle.

17. The method of claim 16, further comprising the step of delivering said light to a solar cell subsequent to said light exiting said light guide.

18. The method of claim 16, wherein said light guide further comprises side walls; and wherein said refracting causes said radiation to refract toward said central axis, to cause a more oblique incidence to said side walls and more total internal reflections in said light guide compared to without said field lens.

\* \* \* \* \*